(12) United States Patent
Huang et al.

(10) Patent No.: US 9,397,650 B2
(45) Date of Patent: Jul. 19, 2016

(54) GATE DRIVING APPARATUS

(71) Applicant: Novatek Microelectronics Corp., Hsinchu (TW)

(72) Inventors: Ying-Neng Huang, Taichung (TW); Chih-Yuan Hsieh, Hsinchu County (TW); Jie-Jung Huang, Miaoli County (TW); Tsung-Yin Yu, Yilan County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 14/684,439

(22) Filed: Apr. 13, 2015

(65) Prior Publication Data

US 2015/0214942 A1  Jul. 30, 2015

Related U.S. Application Data

(62) Division of application No. 13/904,021, filed on May 29, 2013, now abandoned.

(30) Foreign Application Priority Data

May 30, 2012  (TW) .............................. 101119368 A

(51) Int. Cl.
*H03K 17/687* (2006.01)
*H03K 17/14* (2006.01)
*H03K 19/0175* (2006.01)

(52) U.S. Cl.
CPC ...... *H03K 17/145* (2013.01); *H03K 19/017509* (2013.01)

(58) Field of Classification Search
CPC ..................... H03K 19/017509; H03K 17/145
USPC .................................................. 323/312–317
See application file for complete search history.

(56) References Cited

U.S. PATENT DOCUMENTS 6,124,754 A * 9/2000 Afghahi .................. G05F 3/245
 323/315
6,229,382 B1 * 5/2001 Kojima .................. G05F 3/262
 323/315

(Continued)

FOREIGN PATENT DOCUMENTS

JP  2003076346  3/2003
TW  201211972  3/2012
TW  201214968  4/2012

OTHER PUBLICATIONS

"Office Action of China Counterpart Application", issued on Jan. 29, 2016, p1-p5, in which the listed references were cited.

*Primary Examiner* — Ryan Jager
(74) *Attorney, Agent, or Firm* — Jianq Chyun IP Office

(57) ABSTRACT

A gate driving apparatus is disclosed. The gate driving apparatus includes a first gate driving chip and N second gate driving chips, wherein N is positive integer. The first gate driving chip has a first input pin and a first current output pin. The first gate driving chip receives a reference electrical signal by the first input pin, and generates a reference current according to the reference electrical signal. The first current output pin is used for outputting the reference current. Each of the second gate driving chips has a current input pin for receiving the reference current and a second current output pin for outputting the reference current. The first gate driving chip and the second gate driving chips generate at least a first output signal and at least N second output signals according to the reference current.

3 Claims, 12 Drawing Sheets

(56) References Cited

U.S. PATENT DOCUMENTS

| | | | |
|---|---|---|---|
| 6,777,991 B2 * | 8/2004 | Murakami | H03L 7/0802 327/156 |
| 7,230,499 B2 * | 6/2007 | Cang | H03K 3/0315 331/175 |
| 7,352,245 B2 * | 4/2008 | Shih | G05F 3/262 330/257 |
| 7,391,274 B2 * | 6/2008 | Hsu | H03K 3/011 331/185 |
| 7,589,583 B2 * | 9/2009 | Yoshikawa | G11C 5/145 327/536 |
| 7,830,200 B2 * | 11/2010 | Rao | G05F 3/205 323/316 |
| 8,058,854 B2 * | 11/2011 | Kawagishi | H03F 1/308 323/267 |
| 2005/0073513 A1 * | 4/2005 | Date | G09G 3/20 345/204 |
| 2008/0001672 A1 * | 1/2008 | Shih | G05F 3/262 330/288 |
| 2009/0184603 A1 * | 7/2009 | Kawagishi | H03F 1/308 310/317 |
| 2012/0001884 A1 | 1/2012 | Li et al. | |
| 2014/0194947 A1 * | 7/2014 | Parramon | A61N 1/36125 607/46 |

\* cited by examiner

GATE DRIVING APPARATUS

CROSS-REFERENCE TO RELATED APPLICATION

This application is a divisional application of U.S. application Ser. No. 13/904,021, filed on May 29, 2013. The prior application Ser. No. 13/904,021 claims the priority benefit of Taiwan application serial no. 101119368, filed on May 30, 2012. The entirety of each of the above-mentioned patent applications is hereby incorporated by reference herein and made a part of this specification.

BACKGROUND

1. Technical Field

The present invention is related to a gate driving apparatus.

2. Description of Related Art

Referring to FIG. 1, FIG. 1 is a block diagram illustrating a conventional gate driving apparatus 100. The conventional gate driving apparatus 100 includes two gate driving chips 110 and 120 which are connected in series with each other. The gate driving chip 110 has an input pin INPAD1 and an output pin OUPAD1, the gate driving chip 120 has an input pin INPAD2 and an output pin OUPAD2. Wherein, the output pin OUPAD1 of the gate driving chip 110 is coupled to the input pin INPAD2 of the gate driving chip 120, and the input pin INPAD1 of the gate driving chip 110 receives a voltage VB. A bias voltage circuit 112 of the gate driving chip 110 receives the voltage VB through the input pin INPAD1, and a functional block circuit 111 of the gate driving chip 110 generates an output signal (a gate driving signal) GD1 according to the voltage VB. Furthermore, in the gate driving chip 110, the input pin INPAD1 and the output pin OUPAD1 interconnects, and the voltage VB is transmitted to the bias voltage circuit 122 of the gate driving chip 120 from the input pin INPAD1 through the output pin OUPAD1.

Two functional block circuits 111 and 121 respectively generate two output signals GD1 and GD2 according two currents I1 and I2, wherein the currents I1 and I2 are respectively generated by two bias voltage circuits 112 and 122 according to the voltage VB. However, due to the variation of the process parameters between the gate driving chips 110 and 120, the currents I1 and I2 generated by the bias voltage circuits 112 and 122 according to the voltage VB may not be uniform. Therefore, the output signals GD1 and GD2 generated respectively by the functional block circuits 111 and 121 are not uniform.

SUMMARY

The embodiment of the present invention provides a plurality of gate driving apparatus to enable a plurality of gate driving chips within the gate driving apparatus not to generate the output signals with different characteristics due of the fabrication variations.

The embodiment of the present invention provides a gate driving apparatus, including a first gate driving chip and N second gate driving chips, wherein N is a positive integer. The first gate driving chip has an input pin and a first current output pin. The first gate driving chip receives a reference electrical signal by the input pin, and generates a reference current according to the reference electrical signal. The first current output pin outputs the reference current. Wherein, the first gate driving chip and the second gate driving chips further generate at least a first output signal and at least N output signal respectively according to the reference current.

The embodiment of the present invention provides a gate driving apparatus, including a plurality of gate driving chips and a current generator. Each of the gate driving chips has a common pin, and the common pins of the gate driving chip are coupled to each other. One end of the current generator is coupled to the common pin of each gate driving chip, and another end of the current generator is coupled to a reference ground voltage. Wherein, each gate driving chip generates at least an output signal, moreover, each gate driving chip enables the output signal to be pulled-up to a driving voltage or enables the current generator to pull-down the output signal to a reference signal according to a control signal.

Base on the above, the embodiment of the present invention enables each gate driving apparatus to generate an output signal according to the identical reference currents received, wherein the identical reference current is provided by the gate driving chips of the gate driving apparatus. That is, variations in process parameters between each of the gate driving chips does not affect the characteristic of the output signals, hence, the uniformity of the output signals generated by the gate driving apparatus is enhanced effectively.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention as recited in the appended claims.

Figure 1:
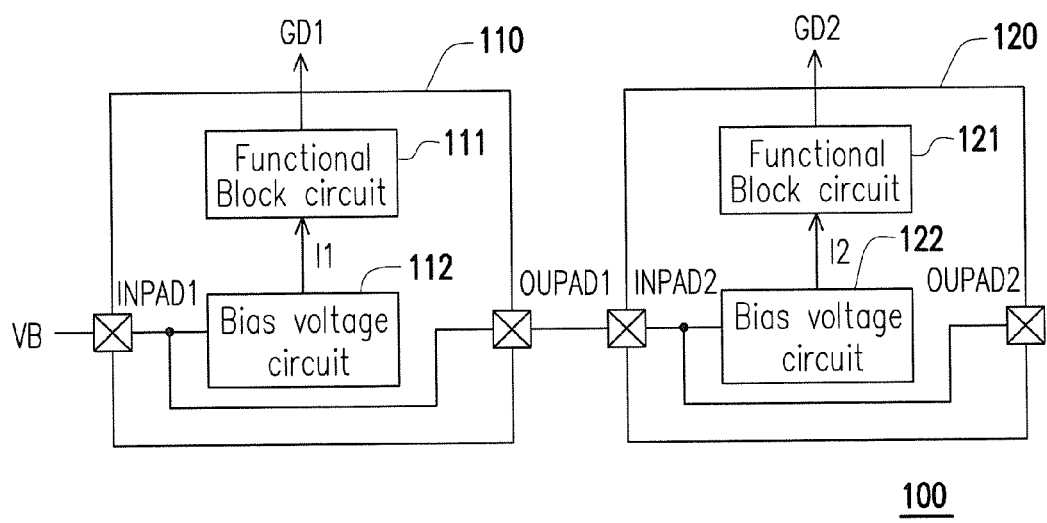
FIG. 1 is a block diagram illustrating a conventional gate driving apparatus 100.
Figure 2:
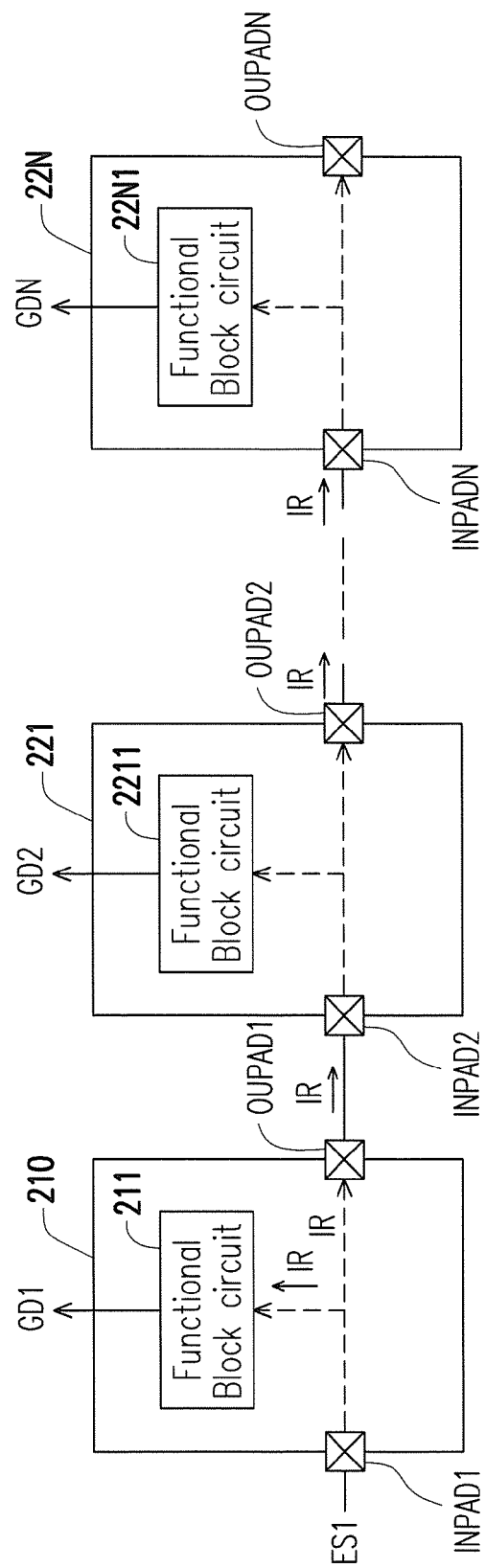
FIG. 2 is a diagram illustrating a gate driving apparatus 200 according to an embodiment of the present invention.

Referring to FIG. 2, FIG. 2 is a diagram illustrating a gate driving apparatus 200 according to an embodiment of the present invention. The gate driving apparatus 200 includes a first gate driving chip 210 and a plurality of second gate driving chips 211-22N. The first gate driving chip 210 has an input pin INPAD1 and a current output pin OUPAD1. The second gate driving chips 221-22N have a plurality of current input pins INPAD2-INPADN and a plurality of current output pins OUPAD2-OUPADN respectively. In the present embodiment, the first gate driving chip 210 receives a reference electrical signal ES1 through the input pin INPAD1. The first gate driving chip 210 generates a reference current IR according to the reference electrical signal ES1. Wherein, the reference current IR is transmitted to the current output pin OUPAD1 of the first gate driving chip 210, the reference current IR is then transmitted to the second gate driving chips 221 of first level through the current output pin OUPAD1.

The first gate driving chip 210 further includes a functional block circuit 221. In addition to the current output pin OUPAD1, the reference current IR is also transmitted to the functional block circuit 211. The functional block circuit 211 generates an output signal GD1 according to the reference current IR received. In detail, the output signal GD1 generated by the first gate driving chip 210 may be used as a gate driving signal of a display panel. In other words, the output signal GD1 is a signal used to drive the transition between high gate driving voltage level and low gate driving voltage level for a thin film transistor in a display panel. When the output signal GD1 is transitioned to a low gate driving voltage level from a high gate driving voltage level, the functional block circuit 211 may pull-down the voltage level of the output signal GD1 according to the reference current IR.

In addition, the functional block circuit 211 may generate one or more output signals GD1.

The current input pin INPAD2 of the second gate driving chips 221 and the current output pin OUPAD1 of the first gate driving chip 210 are coupled together. Moreover, the second gate driving chips 221 receives the reference current IR through the current input pin INPAD2, and the reference current IR is transmitted to the current output pin OUPAD2. Furthermore, the reference current IR is transmitted to the second gate driving chips 221-22N through the coupling relationship between each level of the second gate driving chips 221-22N.

The second gate driving chips 221-22N include a plurality of functional block circuits 2211-22N1 respectively. A plurality of output signals GD2-GDN are respectively generated based on the reference current IR received by the functional block circuits 2211-22N1. It should be noted that the reference currents IR received by the functional block circuits 2211-22N1 of the second gate driving chips 221-22N and then used to pull down the output signals GD2-GDN are the same reference currents IR. Moreover, the functional block circuit 211 of the first gate driving chip 210 also pulls down the output signal GD1 generated by the functional block circuit 211 according to the reference current IR. Therefore, when the output signals GD1-GDN generated by the gate driving apparatus 200 are pulled down to the low gate voltage level, the dropping rate of the output signals GD1-GDN do not vary with the variation of the fabrication parameter between the first gate driving chip 210 and the second gate driving chips 221-22N. In other words, the uniformity of the output signals GD1-GDN of the gate driving apparatus 200 may be enhanced effectively.

In addition, the functional block circuits 2211-22N1 may generate one or more output signals GD2-GDN.

Figure 3A:
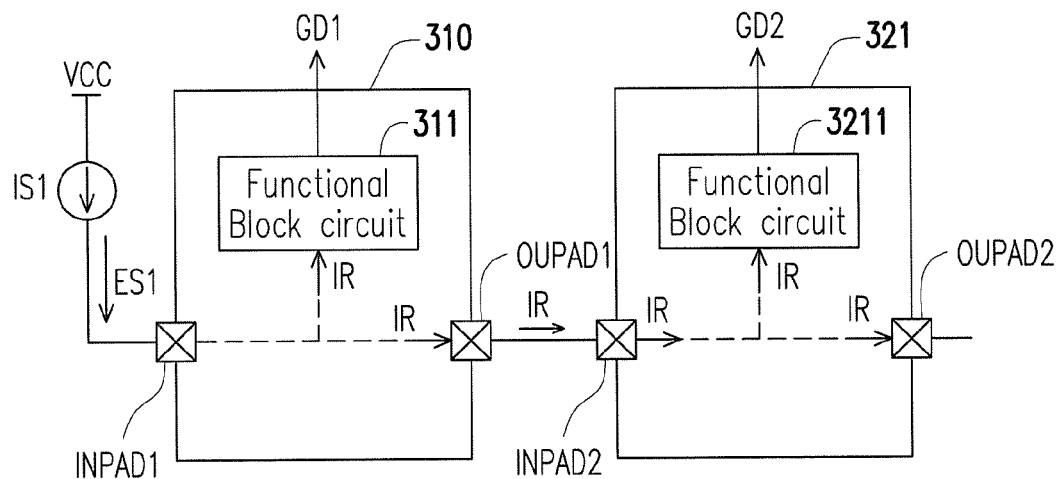
FIG. 3A is a diagram illustrating a gate driving apparatus 300 according to another embodiment of the present invention.

Referring to FIG. 3A, FIG. 3A is a diagram illustrating a gate driving apparatus 300 according to another embodiment of the present invention. The gate driving apparatus 300 includes a reference electrical signal generator IS1, a first gate driving chip 310, and a second gate driving chip 321. In the present embodiment, the reference electrical signal generator IS1 is a current source, and coupled between an input pin INPAD1 of the first gate driving chip 310 and an operating voltage VCC. The reference electrical signal generator IS1 generates a reference signal ES1 as a reference current IR. The reference current IR is transmitted to a functional block circuit 311 in the first gate driving chip 310 and a current output pin OUPAD1 of the first gate driving chip 310 through the input pin INPAD1.

A current input pin INPAD2 of the second gate driving chip 321 is coupled to the current output pin OUPAD1 of the first gate driving chip 310, and receives the reference current IR. The reference current IR is then transmitted to the functional block circuit 3211 in the second gate driving chip 321 and a current output pin OUPAD2 of the second driving chip 321 through the current input pin INPAD2.

From the description above, the functional block circuit 311 in the first gate driving chip 310 and the functional block circuit 3211 in the second gate driving chip 321 receive identical reference current IR. Therefore, no variation is generated between the output signals GD1 and GD2 by the affect of the fabrication parameters between the first gate driving chip 310 and the second gate driving chip 321, wherein the output signals GD1 and GD2 are respectively generated by the functional block circuit 311 and the functional block circuit 3211. In other words, the voltage uniformity of the output signals GD1 and GD2 generated by the gate driving apparatus may be enhanced.

Figure 3B:
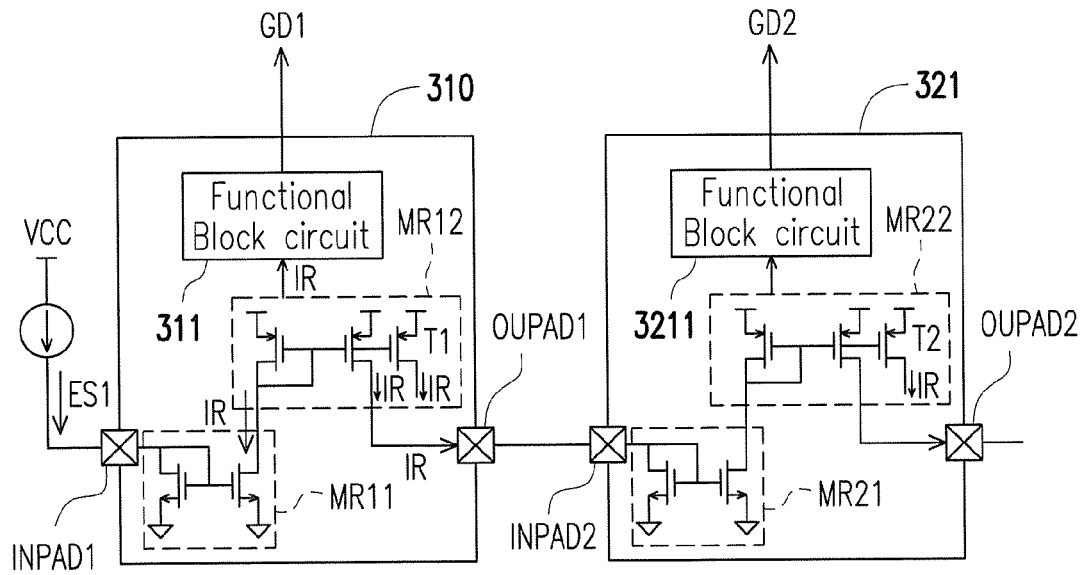
FIGS. 3B-3C respectively illustrate different implementations of the gate driving apparatus 300 according to the embodiment of the present invention.
Figure 3C:
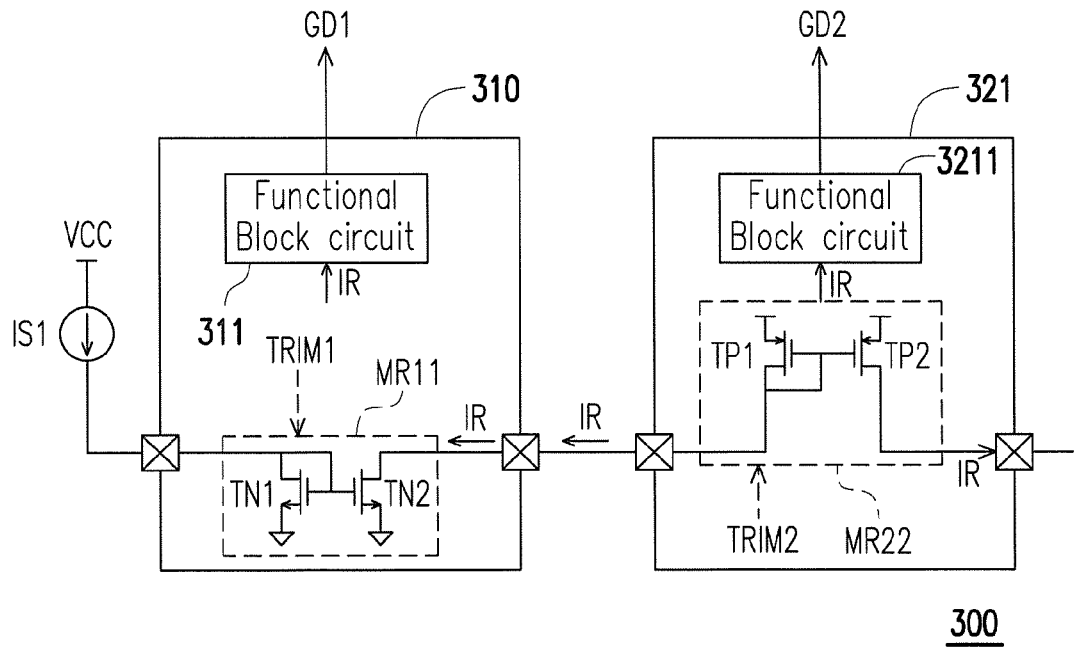

Referring to FIGS. 3B-3C, FIGS. 3B-3C respectively illustrate different implementations of the gate driving apparatus 300 according to the embodiment of the present invention. In FIG. 3B, the first gate driving chip 300 further includes a current mirror MR11 and a current mirror MR12. Wherein, the current mirror MR11 receives the reference electrical signal ES1 provided by the electrical signal generator IS1, and generates the reference current IR by mirroring the reference electrical signal ES1, wherein the reference electrical signal ES1 is a current signal. The current mirror MR12 receives and mirrors the reference current IR generated by the current mirror MR11 in order to output the reference current IR at the current output pin OUPAD1 which the current mirror MR12 is coupled to.

In addition, the current mirror MR12 further includes a transistor T1, and the reference current IR is transmitted to the functional block circuit 311 through a drain of the transistor T1. Wherein the transistor T1 transmits the reference current IR to the functional block circuit 311 by a mirroring method with a ratio of 1:1.

The second gate driving chip 321 further includes a current mirror MR21 and a current mirror MR22. The current mirror MR21 is coupled to the current input pin INPAD2 of the second gate driving chip 321 to receive the reference current IR. The current mirror MR21 transmits the reference current IR to the current mirror MR22 by the mirroring method. Then, the current mirror MR22 receives the reference current IR, through the mirroring method, the reference current IR is transmitted to the current output pin OUPAD2 which the current mirror MR22 is coupled to.

Similarly, the current mirror MR22 further includes a transistor T2. The reference current IR is transmitted to the functional block circuit 3211 through a drain of the transistor T2. Wherein, through the mirroring method, the reference current IR is transmitted to the functional block circuit 3211 by the transistor T2 with a ratio of 1:1.

In the FIG. 3C, the first gate driving chip 310 and the second gate driving chip 321 have a current mirror MR11 and a current mirror MR22 respectively. Wherein, the current mirror MR11 in the first gate driving chip 310 is composed by utilizing a N-type transistor TN1 and a N-type transistor TN2, and the current mirror MR22 in the second gate driving chip 321 is composed by utilizing a P-type transistor TP1 and a P-type transistor TP2. The implementation detail between FIG. 3C and FIG. 3B are the same, hence the detail description is omitted thereto.

It should be noted that the current mirrors MR11 and MR22 receives an adjustment signal TRIM1 and an adjustment signal TRIM2 respectively. The current mirrors MR11 and MR22 may respectively adjust the reference current IR according to the adjustment signals TRIM1 and TRIM2. The adjustment of the reference current IR described above may be attained by adjusting at least one of the width-to-length ratios of the transistors TN1, TN2, TP1, and TP2 through the adjustment signals TRIM1 and TRIM2. The detail regarding to the width-to-length ratio of a transistor is apparent to one of the ordinary skill in the art, hence the detail description is omitted thereto.

Figure 4A:
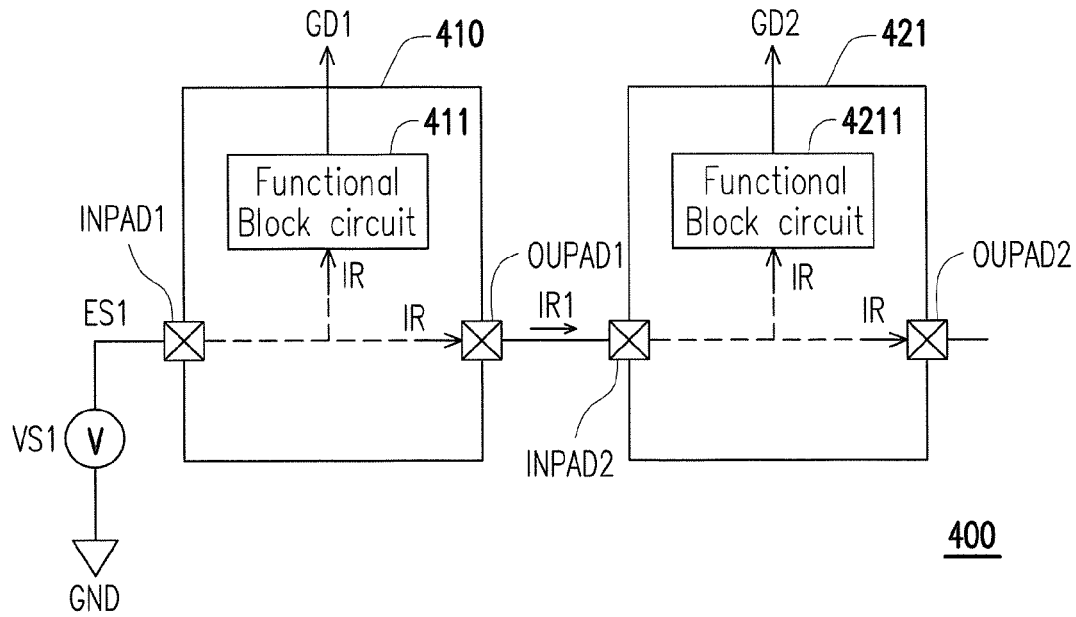
FIG. 4A is a diagram illustrating a gate driving apparatus 400 according to another embodiment of the present invention.

Referring to FIG. 4A, FIG. 4A is a diagram illustrating a gate driving apparatus 400 according to another exemplary embodiment of the present invention. The gate driving apparatus 400 includes a reference electrical signal generator VS1, a first gate driving chip 410, and a second gate driving chip 420. In the present embodiment, the reference electrical signal generator VS1 is a voltage source, which is coupled between an input pin INPAD1 of the first gate driving chip 410 and a reference ground voltage GND. The reference electrical signal generator VS1 generates a reference electrical signal ES1 as a voltage signal, the first gate driving chip 410 converts the reference electrical signal ES1 to generate the reference current IR, and transmits the reference current IR to a functional block circuit 411 in the first gate driving chip 410 and the current output pin OUPAD1 of the first gate driving chip 410 through the input pin INPAD1.

A current input pin INPAD2 of the second gate driving chip 421 is coupled to the current output pin OUPAD1 of the first gate driving chip 410, and receives the reference current IR. The reference current IR is transmitted to a functional bock circuit 4211 in the second gate driving chip 421 and a current output pin OUPAD2 of the second driving chip 421 through the current input pin INPAD2.

From the description above, the functional block circuit 411 in the first gate driving chip 410 and the functional block circuit 4211 in the second gate driving chip 421 receives identical reference current IR. Therefore, no variations are generated between an output signal GD1 and an output signal GD2 by the affect of the fabrication parameters between the first gate driving chip 410 and the second gate driving chip 421, wherein the output signals GD1 and GD2 are generated by the functional block circuit 411 and the functional block circuit 4211 respectively. In other words, the uniformity of the output signals GD1 and GD2 generated by the gate driving apparatus 400 may be enhanced.

Figure 4B:
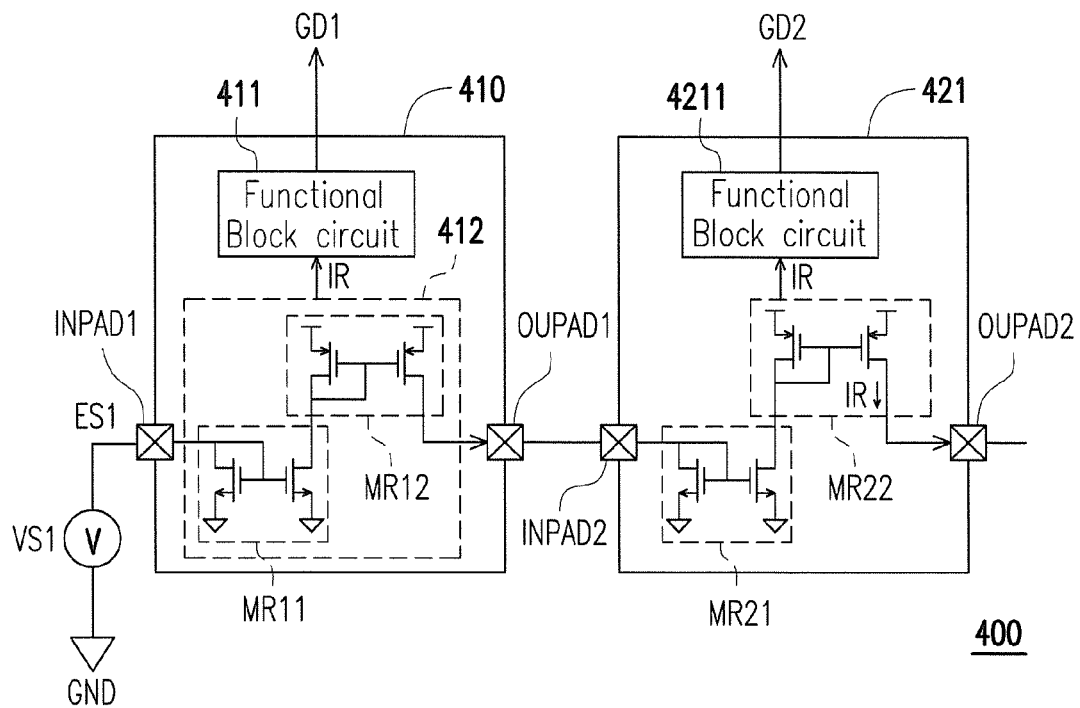
FIGS. 4B-4C respectively illustrate different implementations of the gate driving apparatus 400 according to the embodiment of the present invention.
Figure 4C:
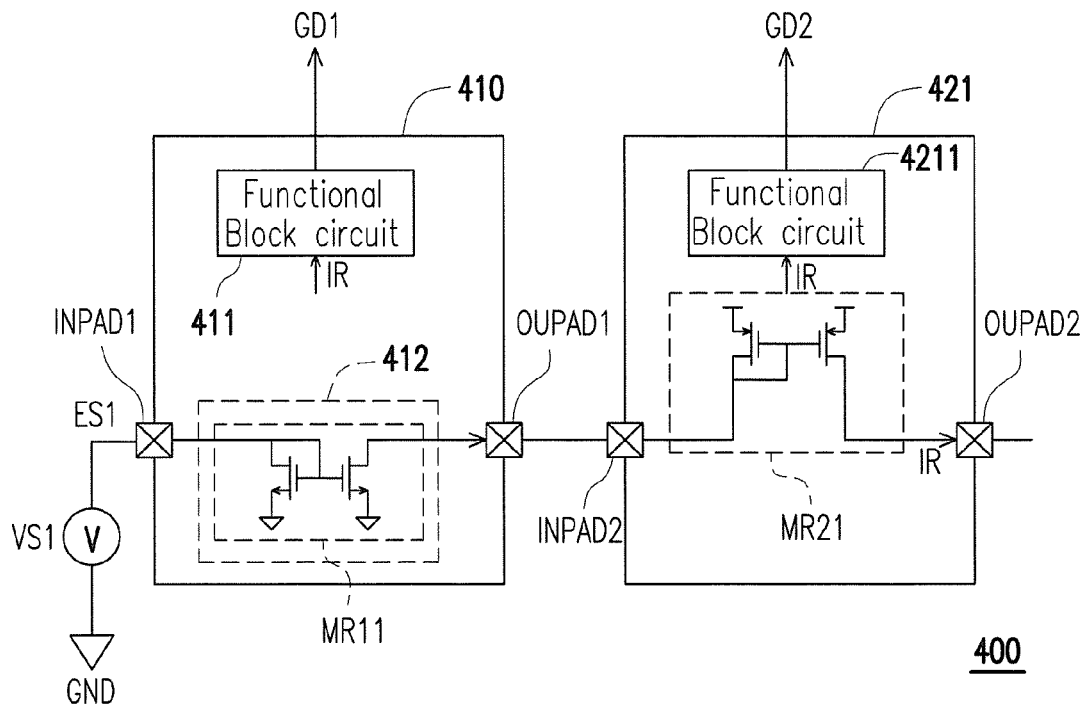

Referring to FIGS. 4B-4C, FIGS. 4B-4C respectively illustrate different implementations of the gate driving apparatus 400 according to the embodiment of the present invention. In FIG. 4B, the first gate driving chip 400 further includes a voltage-current converter 412, the voltage-current converter 412 is coupled to the input pin INPAD1 to receive a reference electrical signal ES1. Wherein the reference electrical signal ES1 is to be a reference voltage, the voltage-current converter 412 converts the reference electrical signal ES1 to generate the reference current IR according to the reference voltage. The voltage-current converter 412 includes two current mirrors MR11 and MR12. The current mirror MR11 receives the reference electrical signal ES1 to be a bias voltage, and generates the reference current IR according to the reference electrical signal ES1. The current mirror MR11 transmits the reference current IR to the current mirror MR12 which is coupled to the current mirror MR11 by the mirroring method.

In the second gate driving chip 421, the current mirror MR12 is coupled between the current mirror MR11 and the current output pin OUPAD2. The current mirror MR12 receives the reference current IR, and transmits the reference current IR to the current output pin OUPAD2 through the mirroring method.

In FIG. 4C, the voltage-current converter 412 only includes a set of current mirror MR11, and the second gate driving chip 421 only includes a set of current mirror MR21. Wherein, the implementation detail of the FIG. 4C is identical as the implementation illustrated in FIG. 4B. Hence, the detail description is omitted thereto.

Figure 5A:
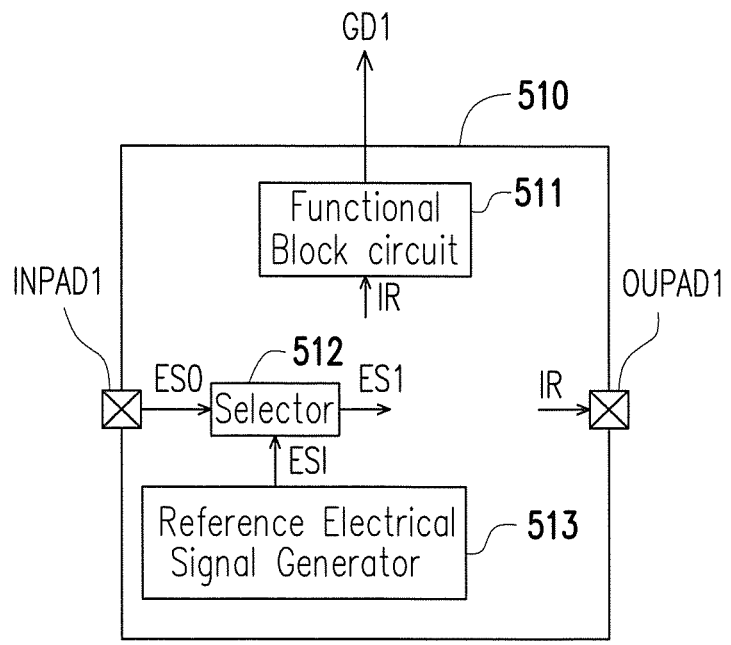
FIG. 5A illustrates an implementation of a first gate driving chip of the gate driving apparatus according to the embodiment of the invention.

Referring to FIG. 5A, FIG. 5A illustrates an implementation of the first gate driving chip of the gate driving apparatus according to the embodiment of the present invention. In the present implementation, the first gate driving chip 510 includes a functional block circuit 511, a selector 512, a reference electrical signal generator 513, an input pin INPAD1, and a current output pin OUPAD1. The reference electrical signal generator 513 is established inside of the first gate driving chip 510. The selector 512 is coupled between the reference electrical signal generator 513 and the input pin INPAD1. The selector 512 may select between a reference electrical signal ESI generated by the reference electrical generator 513 and a reference electrical signal ESO inputted externally through the input pin INPAD1 to input. The first gate driving chip 510 generates the reference current IR according to the result (a reference electrical signal ES1) selected by the selector 512.

In other words, when the reference electrical signal ES1 is a voltage signal, the first gate driving chip 510 may generate the reference current IR according to the reference electrical signal ES1 by converting voltage to current. When the reference electrical signal ES1 is a current signal, the first gate driving chip 510 may use the reference electrical signal ES1 as the reference current IR.

Figure 5B:
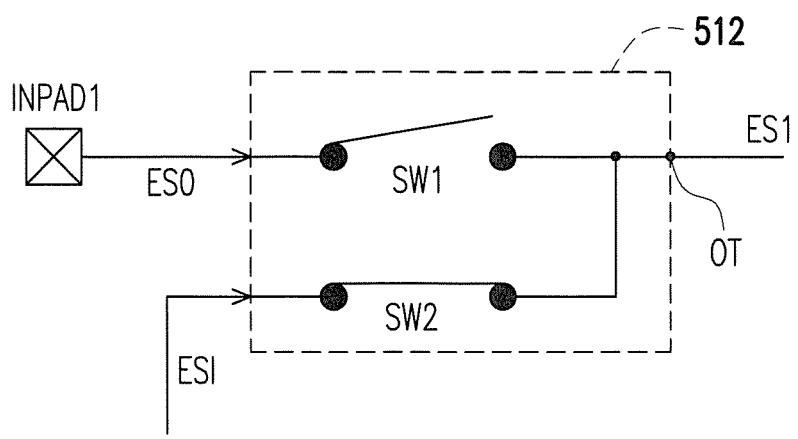
FIG. 5B illustrates an implementation of a selector 512 according to the embodiment of the present invention.

Referring to FIG. 5B, FIG. 5B illustrates an implementation of the selector 512 according to the embodiment of the present invention. The selector 512 includes a switch SW1 and a switch SW2, the switch SW1 is connected in series between the input pin INPAD1 and an output terminal OT of the selector 512, and the switch SW2 is connected in series between the reference electrical signal generator 513 and the output terminal OT of the selector 512. When the switch SW1 is closed, the switch SW1 selectively transmits the reference signal ES0 transmitted from the input pin INPAD1 to the output ten final OT of the selector 512. On the contrary, when the switch SW2 is closed, the switch SW2 selectively transmits the reference electrical signal ESI transmitted from the reference electrical signal generator 513 to the output terminal OT of the selector 512. Moreover, the switches SW1 and SW2 do not closed simultaneously.

Figure 6:
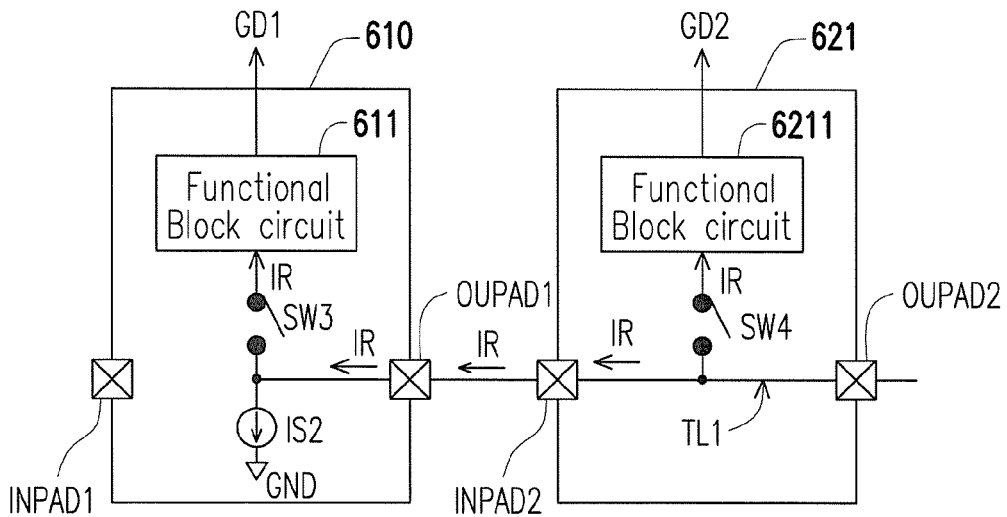
FIG. 6 is a diagram illustrating a gate driving apparatus 600 according to other one embodiment of the present invention.

Referring FIG. 6, FIG. 6 is a diagram illustrating a gate driving apparatus 600 according to an embodiment of the present invention. The gate driving apparatus 600 includes a first gate driving chip 610 and a second gate driving chip 621. The first gate driving chip 610 includes a functional block circuit 611, a switch SW3, a reference electrical signal generator IS2, an input pin INPAD1, and a current output pin OUPAD1. The second gate driving chip 621 includes a functional block circuit 6211, a switch SW4, a transmission line TL1, an input pin INPAD2, and a current output pin OUPAD2. Wherein, in the first gate driving chip 610, the reference electrical signal generator IS2 is a current source, which is configured to provide the reference current IR. Between the first gate driving chip 610 and the second gate driving chip 621, the input pin INPAD2 is coupled to the current output pin OUPAD1, and the reference current IR is transmitted to the second gate driving chip 621 from the first gate driving chip 610 accordingly. In the second gate driving chip 621, the transmission line TL1 is coupled between the input pin INPAD2 and the current output pin OUPAD2, which is configured to transmit the reference current IR to the second gate driving chip of next level.

The switch SW3 is connected in series between the functional block circuit 611 and the reference electrical signal generator IS2, the switch SW4 is connected in series between the functional block circuit 6211 and the reference electrical signal generator IS2. When the switches SW3 and SW4 are closed, the reference current IR is transmitted to the functional block circuit 611 and the functional block circuit 6211 respectively.

Figure 7A:
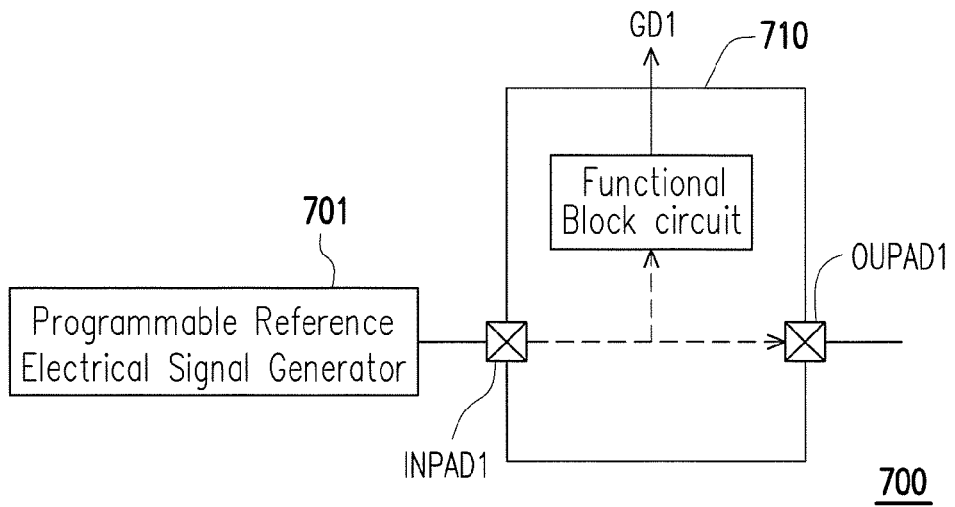
FIG. 7A is a diagram illustrating a gate driving apparatus 700 according to other one embodiment of the present invention.

Referring to FIG. 7A, FIG. 7A is diagram illustrating a gate driving apparatus 700 according to other one embodiment of the present invention. The gate driving apparatus 700 includes a first gate driving chip 710 and a programmable reference electrical signal generator 701. The programmable reference electrical signal generator 701 is coupled to an input pin INPAD1 of the first gate driving chip 710 to transmit a reference electrical signal ES1. The current output pin OUPAD1 of the first gate driving chip 710 is coupled to a first level second gate driving chip (not shown).

The programmable reference electrical signal generator 701 has a programmable interface for receiving a command signal SPIS. The programmable reference electrical signal generator 701 generates the reference electrical signal ES1 according to the command signal SPIS. Wherein the programmable interface may be a serial peripheral interface.

Figure 7B:
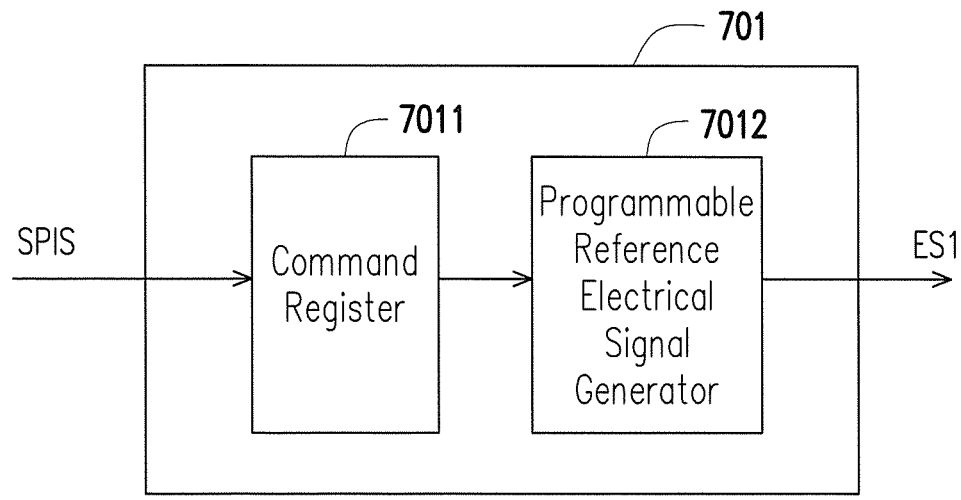
FIG. 7B illustrates an implementation of a programmable reference electrical signal generator 701 according to the embodiment of the present invention.

Referring to FIG. 7B, FIG. 7B illustrates an implementation of the programmable reference electrical signal generator 701 according to the embodiment of the present invention. The programmable reference electrical signal generator 701 includes a command register 7011 and a reference electrical signal generator 7012. The command register 7011 receives and temporally stores the command data transmitted by the command signal SPIS. The reference electrical signal generator 7012 is coupled to the command register 7011 and the input pin INPAD1. The reference electrical signal generator 7012 generates and/or adjusts the reference electrical signal ES1 according to the command signal SPIS.

By the programmable reference electrical signal generator 701, the gate driving apparatus 700 of the gate driving apparatus 700 may provide users a programmable interface to adjust the amount of the reference current in the gate driving apparatus 700. Hence the voltage drop rate of the output signal generated by the gate driving apparatus 700 may be adjusted.

Figure 8A:
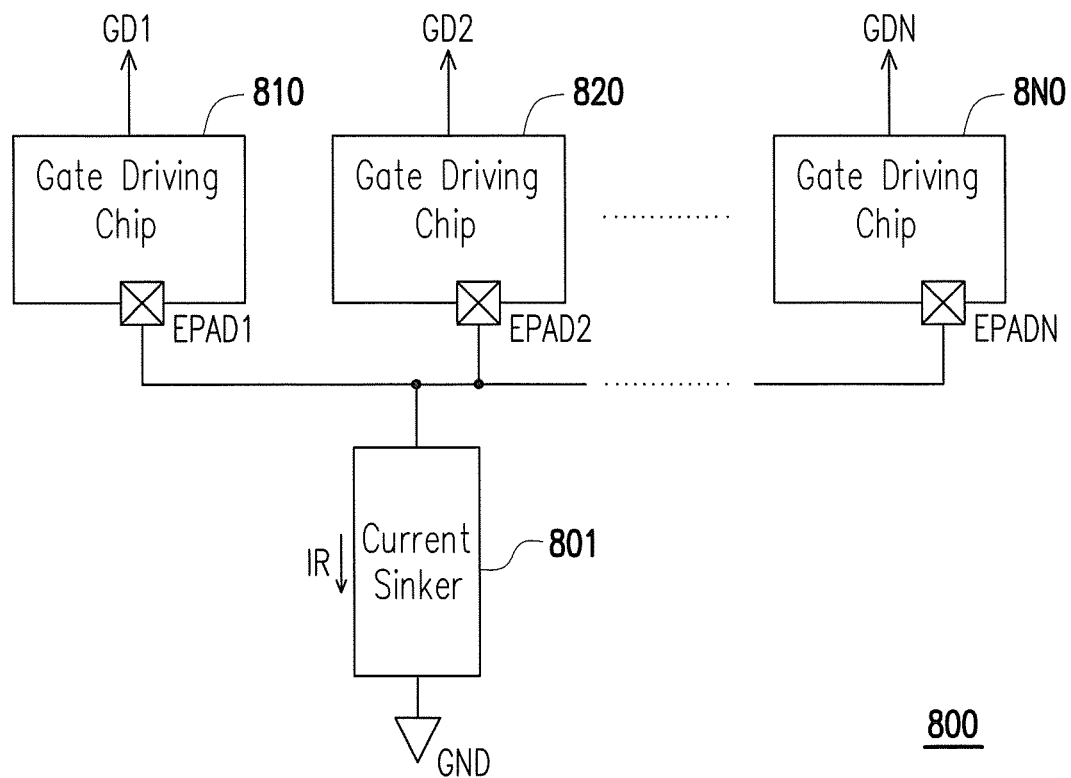
FIG. 8A is a diagram illustrating a gate driving apparatus 800 according to the embodiment of the present invention.

Referring to FIG. 8A, FIG. 8A is a diagram illustrating a gate driving apparatus 800 according to the embodiment of the present invention. The gate driving apparatus 800 includes a plurality of gate driving chips 810-8N0 and a current sinker 801. The gate driving chips 810-8N0 have a plurality of common pins EPAD1-EPADN, and the common pins EPAD1-EPADN of the gate driving chips 810-8N0 are coupled to each other. One end of the current sinker 801 is coupled to the common pins EPAD1-EPADN of the gate driving chips 810-8N0, and another end of the current sinker 801 is coupled to the reference ground voltage GND. The current sinker 801 is configured to drain the reference current IR to the reference ground voltage GND from each of the common pins EPAD1-EPADN of the gate driving chips 810-8N0. Wherein each of the gate driving chips 810-8N0 generates at least one output signal GD1-GDN. Each of the gate driving chips 810-8N0 enables the output signals GD1-GDN to be pulled-up to the driving voltage according to a control signal, or pulled-down to the reference ground voltage GND by the current sinker 801.

It should be noted that, in the present embodiment, the current generator provides all the reference current IR that are configured to pull-down the output signals GD1-GDN of the gate driving chips 810-8N0. Therefore, the capabilities of pulling-down the output signals GD1-GDN of the gate driving chips 810-8N0 are the same. In other words, the pull-down rate of the output signals GD1-GDN are the same.

Furthermore, the reference ground voltage GND may be a voltage level of zero volt or any other nonzero voltage level.

Figure 8B:
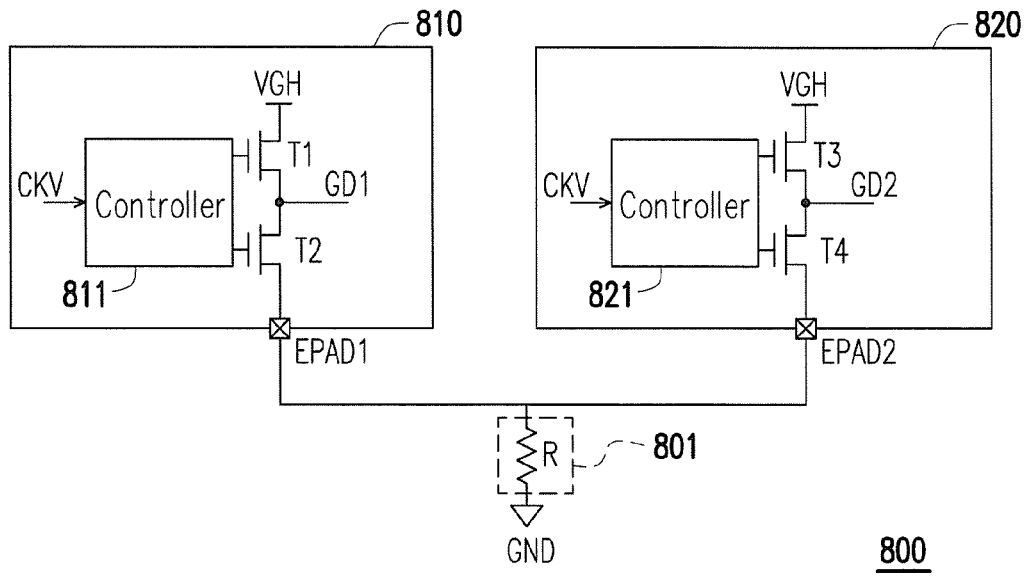
FIGS. 8B-8E respectively illustrate different implementations of the gate driving apparatus 800 according to the embodiment of the present invention.

Referring to FIGS. 8B-8E, FIGS. 8B-8E respectively illustrate different implementations of a gate driving apparatus 800 according to the embodiment of the present invention. In FIG. 8B, the gate driving apparatus 800 includes a gate driving chip 810 and a gate driving chip 820. The gate driving chip 810 includes a gate driving circuit composed by a controller 811, a transistor T1, and a transistor T2. The gate driving chip 820 includes a gate driving circuit composed by a controller 821, a transistor T3, and a transistor T4. According to a clock signal CKV, the controllers 811 and 821 provide control signals to gates of the transistors T1-T2 and gates of the transistors T3-T4 respectively. In the gate driving chip 810, a first terminal of the transistor T1 is coupled to a second reference voltage (the second reference voltage is a driving voltage VGH in the present embodiment), a control terminal of the transistor T1 is the gate of the transistor T1, and a second terminal of the transistor T1 generates the output signal GD1. A first terminal of the transistor T2 is coupled to the second terminal of the transistor T1, a control terminal of the transistor T2 is the gate of the transistor T2, and the second terminal of the transistor T2 is coupled to the common pin EPAD1 of the gate driving chip 810.

In the gate driving chip 820, a first terminal of the transistor T3 is coupled to the driving voltage VGH, a control terminal of the transistor T3 is the gate of the transistor T3, and a second terminal of the transistor T3 generates the output signal GD2. A first terminal of the transistor T4 is coupled to the second terminal of the transistor T3, a control terminal of the transistor T4 is the gate of the transistor T4, and a second terminal of the transistor T4 is coupled to the common pin EPAD2 of the gate driving chip 820.

In the present embodiment, the current sinker 801 is a resistor R, the resistor R is connected in series between the common pins EPAD1-EPAD2 and a first reference voltage (the first reference voltage is the reference ground voltage GND in the present embodiment). When the transistor T2 is turned on, the output signal GD1 is pulled-down by the reference current IR generated by the resistor R, and drops the voltage level of the output signal GD1 to the reference ground voltage GND.

Figure 8C:
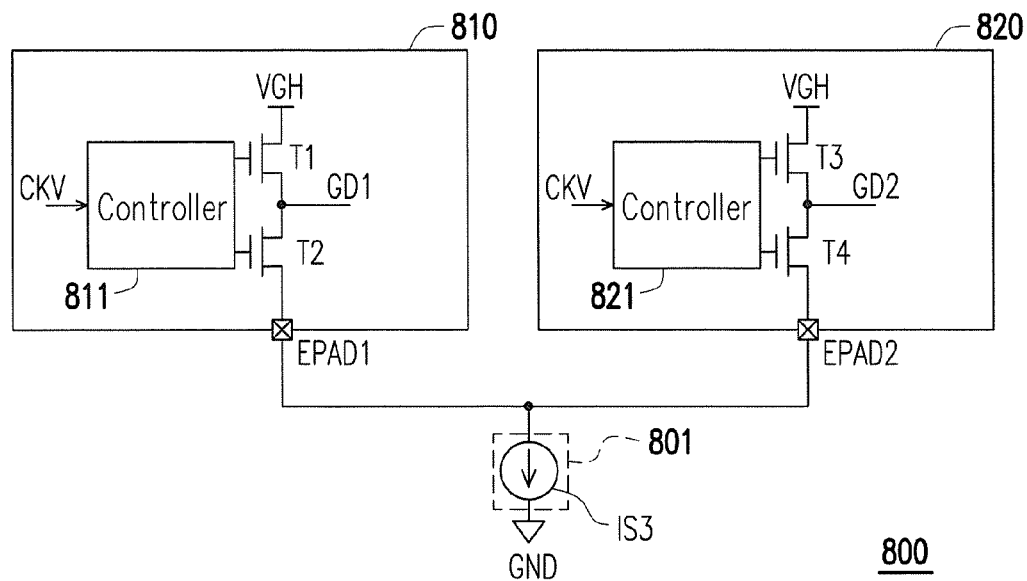

In FIG. 8C, the current sinker 801 is a current source IS3. The current source IS3 is configured to provide the reference current IR which flows to the reference ground voltage GND from one of the common pins EPAD1-EPAD2 to pull-down the output signals GD1 or GD2.

Figure 8D:
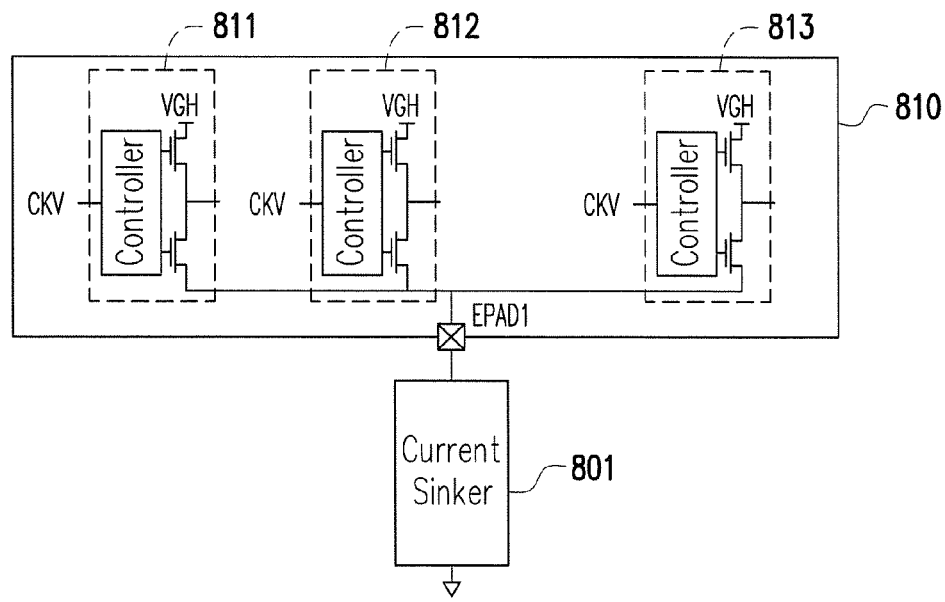

In FIG. 8D, the gate driving chip 810 includes a plurality of gate driving circuits 811-813. Every gate driving circuits 811-813 are coupled to the common pin EPAD1, and coupled to the current sinker 801 by the common pin EPAD1.

Figure 8E:
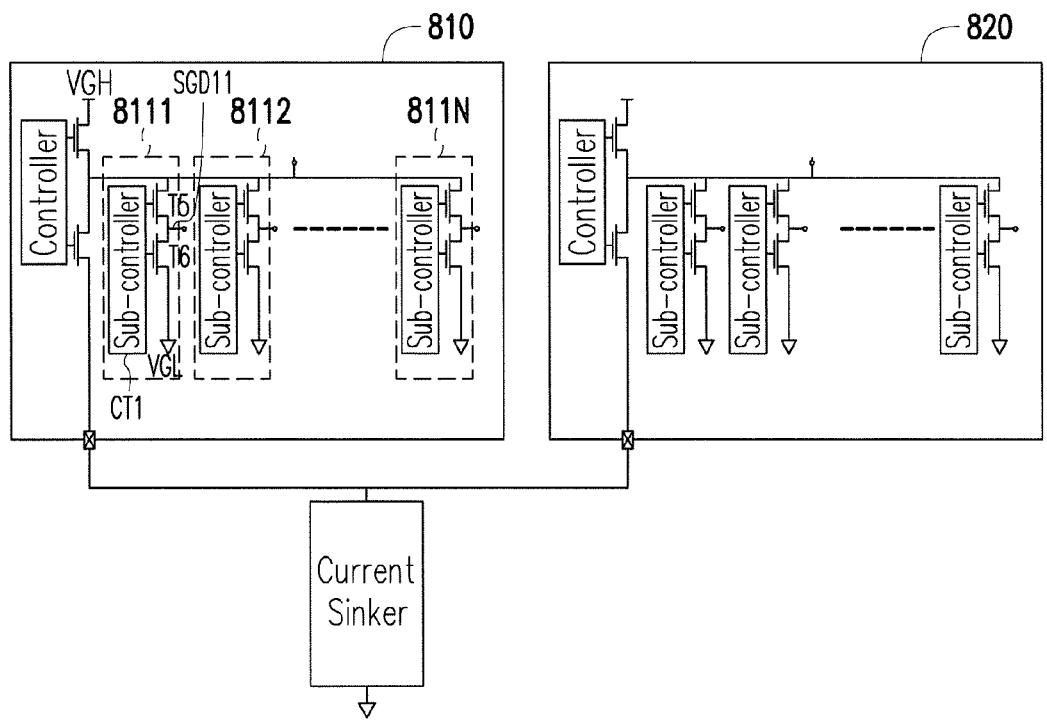

In FIG. 8E, the gate driving circuits in the gate driving chips 810 and 820 further include a plurality of sub-driving circuits. By using gate driving chip 810 as example, the gate driving chip 810 includes a plurality of sub-driving circuits 8111-811N. By using the sub-driving circuit 8111 as example, the sub-driving circuit 8111 includes a sub-controller CT1, a transistor T5, and a transistor T6. The sub-controller CT1 generates a sub-control signal, and the sub-control signal is transmitted to control terminals of the transistors T5 and T6. A first terminal of the transistor T5 receives the output signal, and a second terminal of the transistor T5 generates a sub-output signal SGD11. A first terminal of the transistor T6 receives the sub-output signal SGD11, and a second terminal of the transistor T6 is coupled to a third reference voltage (the third reference voltage is a driving voltage VGL in the present embodiment).

Figure 9A:
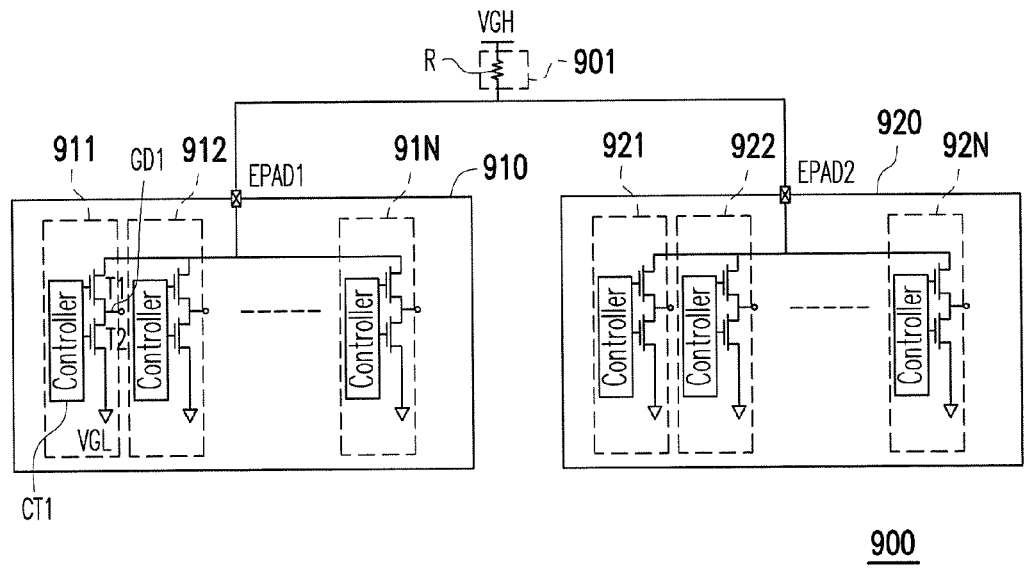
FIGS. 9A-9C respectively illustrate different implementations of a gate driving apparatus 900 according to the embodiment of the present invention.
Figure 9B:
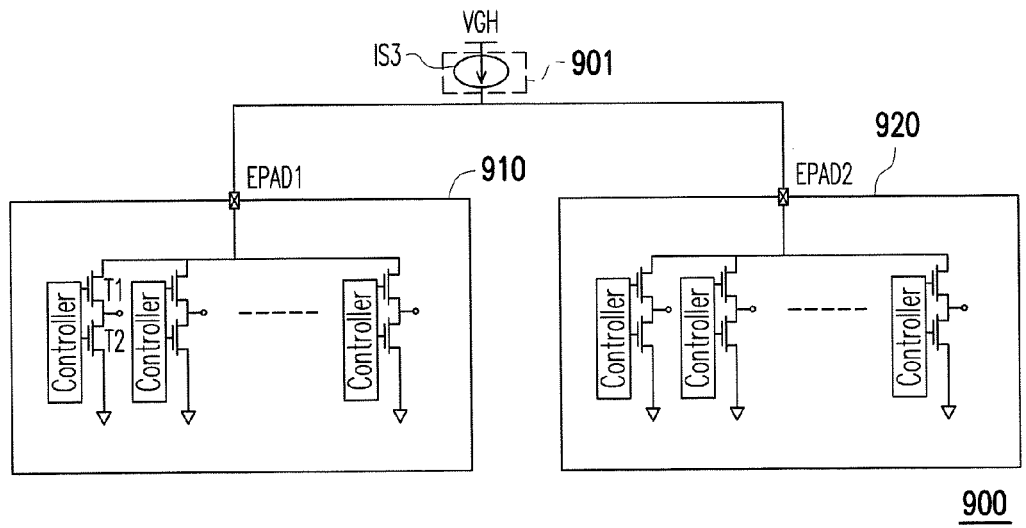
Figure 9C:
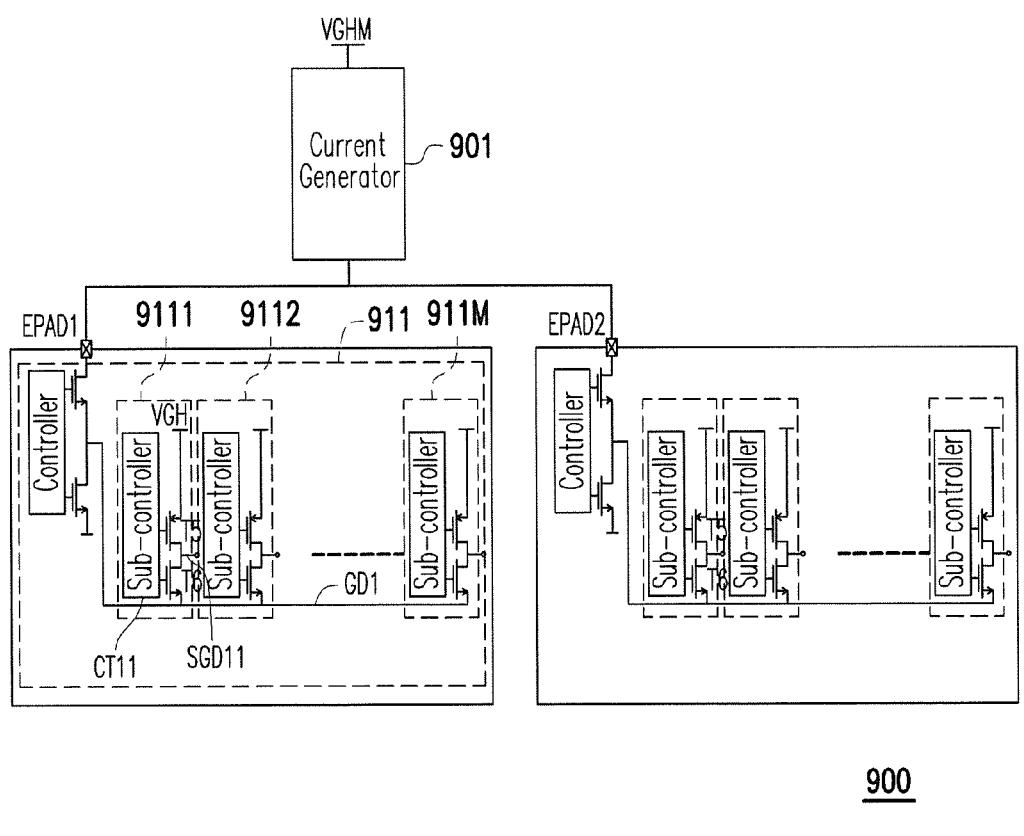

Referring to FIG. 9A-9C, FIG. 9A-9C respectively illustrate different implementations of a gate driving apparatus 900 according to the embodiment of the present invention. In FIG. 9A, the gate driving apparatus 900 includes a gate driving chip 910, a gate driving chip 920, and a current generator 901. The gate driving chips 910 and 920 have two common pins EPAD1 and EPAD2 respectively, the common pins EPAD1 and EPAD2 are coupled with each other. One end of the current generator 901 is coupled to the common pins EPAD1 and EPAD2 of the gate driving chips 910 and 920. Another end of the current generator 901 is coupled to a first reference voltage (the first reference voltage is a driving voltage VGH in the present embodiment). The current generator 901 provides the reference current between the common pins EPAD1, EPAD2 of the gate driving chips 910, 920 and the driving voltage VGH respectively.

The gate driving chip 910 includes at least one of the gate driving circuits 911-91N, the gate driving chips 920 includes at least one of the gate driving circuits 921-92N. By using the gate driving circuit 911 as example, the gate driving circuit 911 includes a controller CT1 and two transistors T1 and T2. The transistor T1 has a first terminal, a second terminal and a control terminal. The first terminal of the transistor T1 is coupled to a second reference voltage (the second reference voltage is a reference ground voltage GND in the present embodiment), the second terminal of the transistor T1 generates an output signal GD1, wherein the control terminal of the transistor T1 receives a control signal generated by the controller CT1. The transistor T2 has a first terminal, a second terminal, and a control terminal. The first terminal of the second transistor T2 is coupled to the second terminal of the transistor T1, the control terminal of the transistor T2 receives the control signal generated by the controller CT1, and the second terminal of the transistor T2 is coupled to the driving voltage VGL. In the present implementation, the current generator 901 is composed by the resistor R.

In FIG. 9B, the current generator 901 is composed by a current source IS3, which is different from the implementation in FIG. 9A.

Furthermore, in FIG. 9C, the gate driving circuit 911 in the gate driving chip 910 further includes a plurality of sub-driving circuit 9111-911M. By using the sub-driving circuit 9111 as example, the sub-driving circuit 9111 includes a sub-controller CT11, a transistor T5, and a transistor T6. A first terminal of the transistor T6 receives the output signal GD1, a second terminal of the transistor T6 generates output signal SGD11, wherein a control terminal of the transistor T6 receives a sub-control signal generated by the sub-controller CT11. A first terminal of the transistor T5 is coupled to a sub-output signal SGD11, a second terminal of the transistor T5 receives the first reference voltage (the first reference voltage equals to the driving voltage VGH), wherein a control terminal of the transistor T5 receives the sub-control signal generated by the sub-controller CT11.

In addition, the current generator 901 of the present embodiment is connected in series between the common pins EPAD1, EPAD2 and a driving voltage VGHM.

In summary, through the identical reference currents of the plurality of gate driving chips in the gate driving apparatus, each of the gate driving apparatus may pull-down and/or pull-up the output signals generated according to the identical reference currents received. Therefore, uniformity of the output signals is maintained, and efficiency of the gate driving apparatus is enhanced.

Although the present invention has been described with reference to the above embodiments, however, the present invention is not limited thereto. It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A gate driving apparatus, comprising:
  a first gate driving chip, the first gate driving chip comprises a input pin and a first current output pin, the first gate driving chip receives a reference electrical signal through the input pin and generates a reference current according to the reference electrical signal, the first current output pin outputs the reference current; and
  N second gate driving chips, the second gate driving chips are coupled with each other in series, each of the second gate driving chips comprises a current input pin and a second current output pin, an input current is received through the current input pin and an output current is generated by mirroring the input current and outputted by the second current output pin, the current input pin of the first chip of the second gate driving chips is coupled to the first current output pin of the first gate driving chip to receive the reference current, N is a positive integer,
  wherein, the first gate driving chip and the second gate driving chips further respectively generate at least one first output signal and at least N second output signals to drive a display panel according to the reference current, wherein the first gate driving chip comprises:

a reference electrical signal generator, coupled to the input pin and configured to generate the reference electrical signal; and a selector, coupled between a coupling path of the reference electrical signal generator and the input pin, though the selector, the first gate driving chip selectively receives the reference electrical signal generated from outside of the first gate driving chip or the reference electrical signal generated by the reference signal generator according to a selection signal.

2. The gate driving apparatus as claimed in claim 1, wherein the reference electrical signal generator is a current source, configured to generate the reference electrical signal of current signal as the reference electrical current, wherein the current source is coupled to the first current output pin through a first transmission line, and the reference current is transmitted to the first current output pin through the first transmission line.

3. The gate driving apparatus as claimed in claim 2, wherein each of the second gate driving chips comprises a second transmission line, the second transmission line is coupled between the current input pin of each of the second gate driving chips and the second current output pin of each of the second gate driving chips.

* * * * *